United States Patent [19]
Zuras, Jr. et al.

[11] Patent Number: 5,539,754
[45] Date of Patent: Jul. 23, 1996

[54] METHOD AND CIRCUITRY FOR GENERATING SYNDROME BITS WITHIN AN ERROR CORRECTION AND DETECTION CIRCUIT

[75] Inventors: George D. Zuras, Jr., San Jose, Calif.; Alexander J. Neudeck, Fort Collins, Colo.

[73] Assignee: Hewlett-Packard Company, Palo Alto, Calif.

[21] Appl. No.: 957,536

[22] Filed: Oct. 5, 1992

[51] Int. Cl.⁶ .................................................. G06F 11/10
[52] U.S. Cl. .......................................................... 371/37.1
[58] Field of Search ................................. 371/37.1, 37.6, 371/40.1

[56] References Cited

U.S. PATENT DOCUMENTS

| | | | |
|---|---|---|---|
| 3,601,798 | 8/1971 | Hsiao | 371/37.9 |
| 3,648,239 | 3/1972 | Carter et al. | 371/37.7 |
| 3,825,893 | 7/1974 | Bossen et al. | 371/37.6 |
| 3,836,957 | 9/1974 | Duke et al. | 340/146.1 AL |
| 3,873,971 | 3/1975 | En | 340/146.1 AQ |
| 3,944,973 | 3/1976 | Masson | 371/37.1 |
| 4,450,561 | 5/1984 | Götze et al. | 371/37.6 |
| 4,464,753 | 8/1984 | Chen | 371/38 |
| 4,486,882 | 12/1984 | Piret et al. | 371/45 |
| 4,523,314 | 6/1985 | Burns et al. | 371/38 |
| 4,599,722 | 7/1986 | Mortimer | 371/37 |
| 4,692,922 | 9/1987 | Kiriu et al. | 371/37.1 |
| 4,712,216 | 12/1987 | Glaise | 371/38 |
| 4,868,829 | 9/1989 | Tan | 371/37.2 |
| 4,890,286 | 12/1989 | Hirose | 371/37.1 |
| 4,914,660 | 4/1990 | Hirose | 371/37.1 |
| 4,964,129 | 10/1990 | Bowden, III et al. | 371/40.2 |
| 4,993,028 | 2/1991 | Hillis | 371/39.1 |
| 4,998,253 | 3/1991 | Ohashi et al. | 371/43 |
| 5,124,992 | 6/1992 | Kamanou et al. | 371/37.1 |
| 5,164,944 | 11/1992 | Benton et al. | 371/40.1 |
| 5,291,498 | 3/1994 | Jackson et al. | 371/40.1 |

OTHER PUBLICATIONS

Hsiao, M., "A Class of Optimal Minimum Odd-weight-column SEC-DED Codes", *IBM J. Res. Develop.*, Jul. 1970, pp. 395-401.

Fujiwara, E., et al., "Rotational Byte Error Detecting Codes for Memory Systems", *Trans. IECE Japan*, vol. E64, No. 5, May 1981, pp. 342-349.

E. W. Glick et al., *Single-Error Correction, Double-Error Detection Code Utilizing Minimum Circuitry*, IBM Technical Disclosure Bulletin, vol. 15 No. 1, Jun. 1972.

S. M. Dobrynski, *Optimum and Symmetrical Error Correction Code*, IBM Technical Disclosure Bulletin, vol. 13 No. 10, Mar. 1971.

*Primary Examiner*—Stephen M. Baker

[57] ABSTRACT

A method and circuit allows for generating syndrome bits from a plurality of data bits and a plurality of correction bits. The plurality of data bits are divided into subsets. From each subset of data bits, a plurality of syndrome bit partial products are generated using a logic gate tree, for example of XOR logic gates or XNOR logic gates. Each logic gate tree generates a syndrome bit partial product for each syndrome bit. The syndrome bits are generated from the syndrome bit partial products and from the correction bits, for example using XOR logic gates or XNOR logic gates. Within each logic gate tree, logic gates are arranged in rows. Each row of logic gates is used to generate a syndrome bit partial product for at least one syndrome bit.

20 Claims, 9 Drawing Sheets

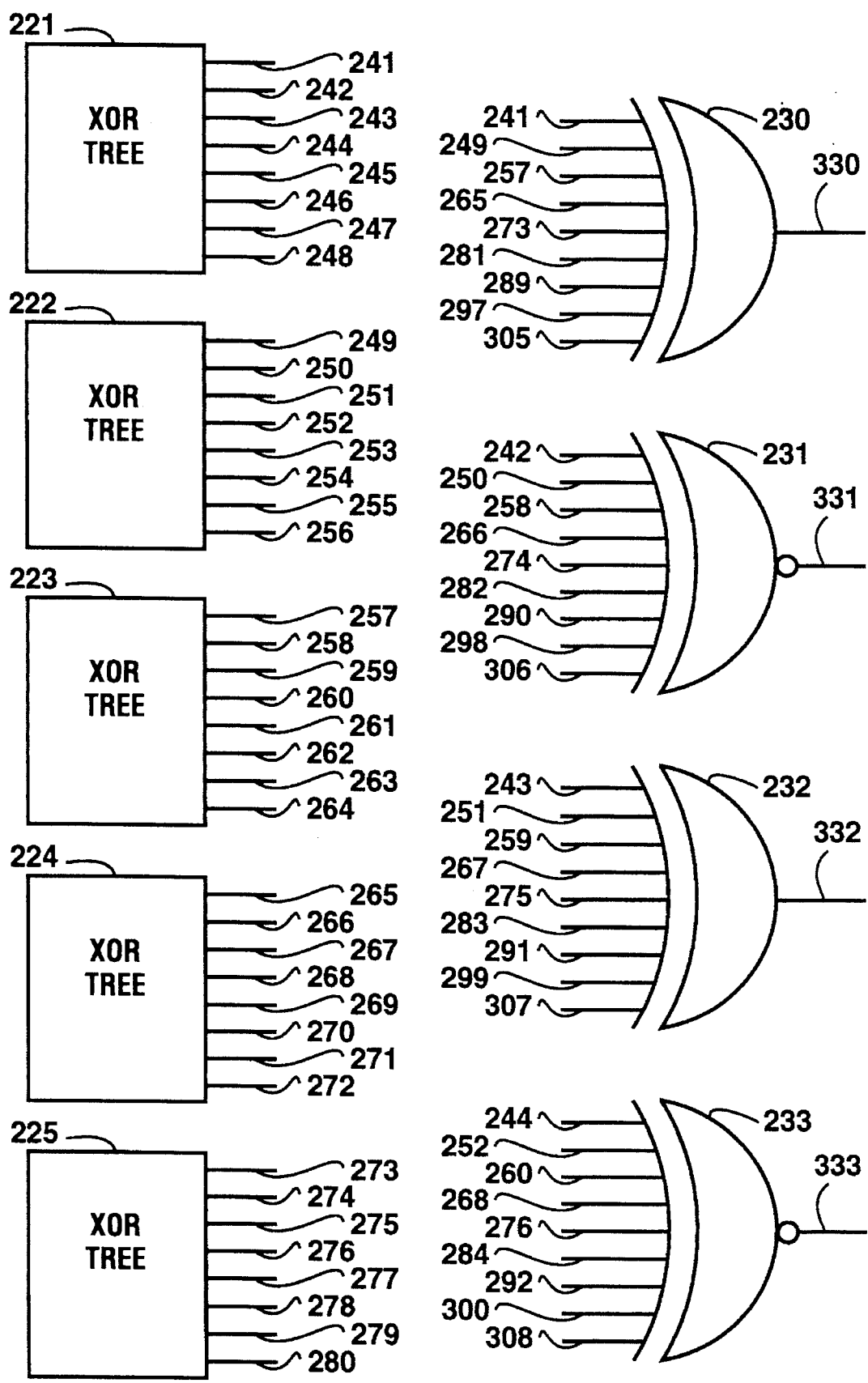
FIG. 5.A

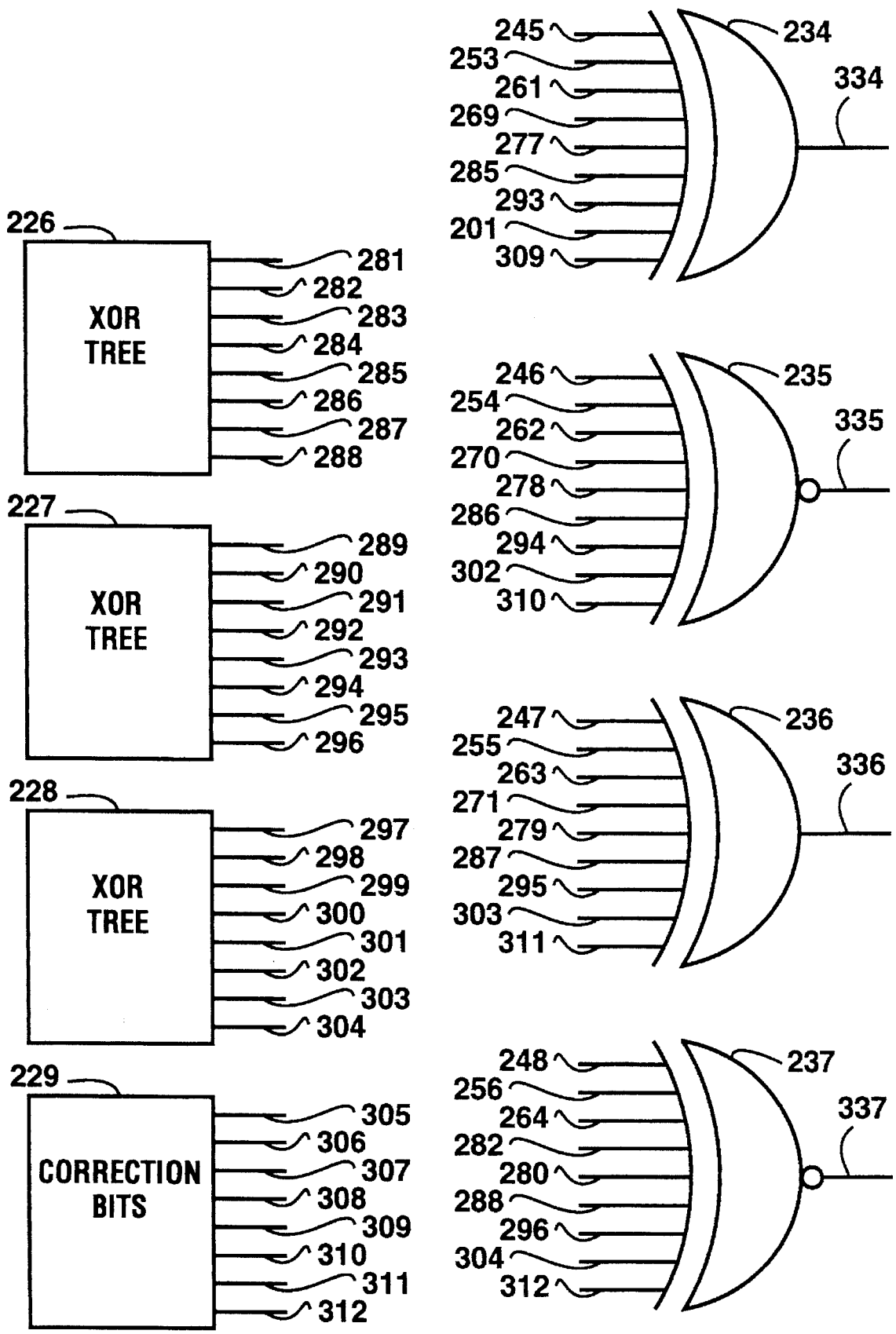
FIG. 5.B

5,539,754

METHOD AND CIRCUITRY FOR GENERATING SYNDROME BITS WITHIN AN ERROR CORRECTION AND DETECTION CIRCUIT

BACKGROUND

The present invention concerns the generation of syndrome bits within an error correcting and detecting circuit used in the transfer of data.

When transferring data within a communication system, it is often desirable to insure the integrity of the data transferred. To this end, various error detection and correction circuits have been utilized. In general, these error detection and correction circuits rely on correction bits sent in data packets with data bits. Data bits and correction bits are used to generate syndrome bits. Depending upon the particular error detection/correction code used, the syndrome bits are used to detect and/or correct errors which arise during data transfer. Such correction schemes serve to prevent the use of corrupted data and allows for correction of some errors in data transfer without resending data. For examples of prior art error detection and correction circuits, see U.S. Pat. No. 3,601,798 issued to M. Hsiao on Apr. 24, 1971 for *Error Correcting and Detecting Systems;* U.S. Pat. No. 3,648,239 issued to M. W. Carter et al. on Mar. 6, 1972 for *System For Translating to and from Single Error Correction-Double Error Detecting Hamming Code and Byte Parity Code;* U.S. Pat. No. 3,825,893 issued to D. Bosen et al. on Jul. 23, 1974 for *Modular Distributed Error Detection and Correction Apparatus and Method;* and, U.S. Pat. No. 4,450,561 issued to V. Goetze et al. on May 22, 1984 for *Method and Device for Generating Check Bits Protecting a Data Word.*

SUMMARY OF THE INVENTION

In accordance with the preferred embodiment of the present invention, a method and circuit for generating syndrome bits from a plurality of data bits and a plurality of correction bits is presented. The plurality of data bits are divided into subsets. From each subset of data bits, a plurality of syndrome bit partial products are generated using a logic gate tree, for example of XOR logic gates or XNOR logic gates. Throughout the Specification and the claims, the term "XOR/XNOR logic gate" is used to indicate the use of a logic gate which is either an XOR logic gate or an XNOR logic gate. Each logic gate tree generates a syndrome bit partial product for each syndrome bit. The syndrome bits are generated from the syndrome bit partial products and from the correction bits, for example using XOR logic gates or XNOR logic gates.

In a preferred embodiment of the present invention, within each logic gate tree, XOR/XNOR logic gates are arranged in rows. Each row of XOR/XNOR logic gates is used to generate a syndrome bit partial product for at least one syndrome bit. In one preferred embodiment, at least one row of XOR/XNOR logic gates in each logic gate tree generates a syndrome bit partial product for at least two syndrome bits. Also, in the preferred embodiment, within each subset of data bits the data bits are arranged in pairs. No XOR/XNOR logic gate receives input from both data bits in a pair. More specifically, the XOR/XNOR logic gates are arranged in columns. Each pair of data bits provides input to only one column of XOR/XNOR logic gates. When a first pair of data bits provides input to a first column, each XOR/XNOR logic gate within the first column receives input from one and only one data bit within the first pair of data bits. Also in the preferred embodiment, for each logic gate tree, identical rows of XOR/XNOR logic gates are used. The rows of logic gates are arranged in a different order for each logic gate tree.

Embodiments of the invention may include any number of data bits. Specific preferred embodiments described below include distance four error correction and detecting codes in which there are thirty-two data bits, seven correction bits and seven syndrome bits and in which there are sixty-four data bits, eight correction bits and eight syndrome bits.

The present invention allows for the implementation of logic for generating syndrome bits within a error correction circuit within a VLSI circuit so that resulting circuitry is regular and utilizes a minimum area.

BRIEF DESCRIPTION OF THE DRAWINGS

FIGS. 5A and 5B shows a block diagram of logic used to generate syndrome bits for an error correcting circuitry in accordance with an alternate preferred embodiment of the present invention.

DESCRIPTION OF THE PREFERRED EMBODIMENT

Figure 1:
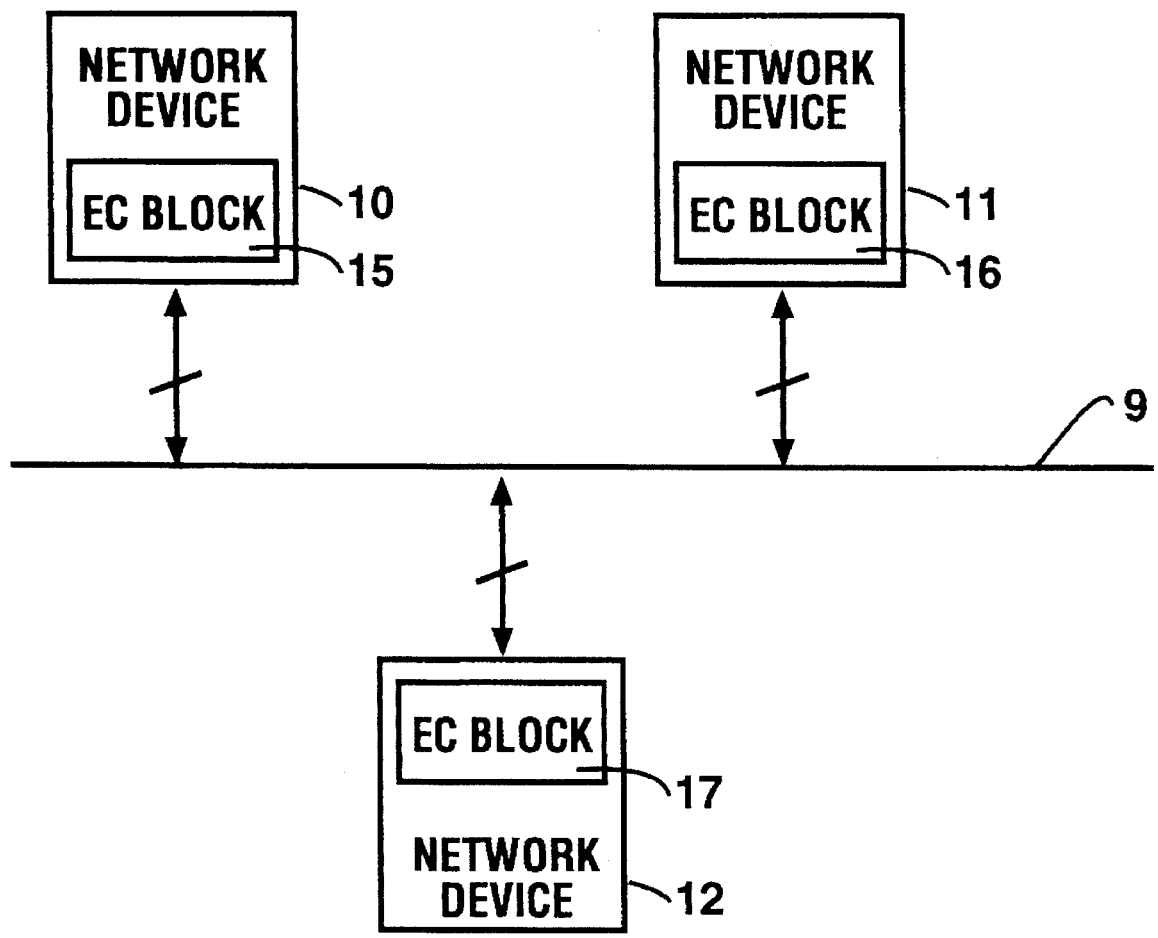
FIG. 1 shows devices with error correcting circuitry connected to a data bus in accordance with a preferred embodiment of the present invention.

FIG. 1 shows a block diagram of a communication system. A network device 10, a network device 11 and a network device 12 are shown connected to a data bus 9. Each network device includes an error correction circuit. For example, network device 10 includes an error correcting block 15, network device 11 includes an error correcting block 16, and network device 12 includes an error correcting block 17.

Figure 2:
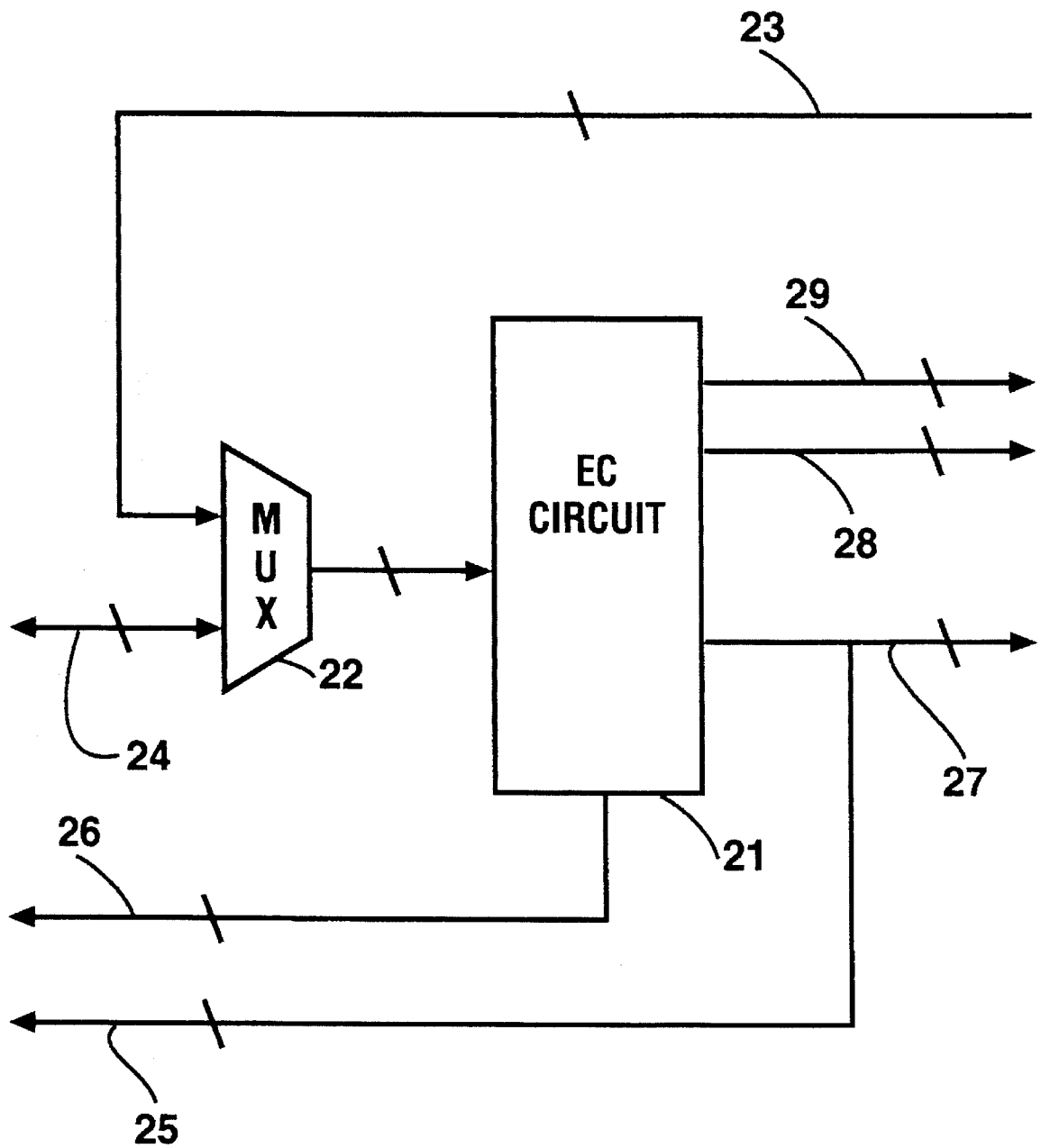
FIG. 2 shows a simplified block diagram of error correcting circuitry in accordance with a preferred embodiment of the present invention.

FIG. 2 is a block diagram of error correcting block 15. A multiplexor 22 selects data and correction bits on lines 23 from circuitry within network device 10 or selects data and correction bits on lines 24 from data bus 9 to be forwarded to an error correction circuit 21. Error correction circuit 21 produces data bits which are forwarded on lines 27 to circuitry within network device 10 or are forwarded on lines 25 to data bus 9. Error correction circuit also produces syndrome bits on lines 26. These are forwarded to data bus 9 and are used as error correction bits. The syndrome bits also may be utilized to produce control signals on a line 28 and a line 29. These control signals indicate whether no errors were detected, a single bit error was corrected or a double bit error was detected.

Table 1 shows how syndrome bits S0 through S6 are calculated by EC circuit 21 for a thirty-two bit balanced distance four error correction code. A distance four error correction code allows for single bit error correction and double bit error detection. Syndrome bits S0 through S6 from performing XOR functions on data bits D0 through D31 as shown in Table 1.

TABLE 1

| Bit | S0 | S1 | S2 | S3 | S4 | S5 | S6 |
|-----|----|----|----|----|----|----|----|
| D0  | X  | X  | X  |    |    |    |    |
| D1  |    | X  | X  | X  |    |    |    |
| D2  |    |    | X  | X  | X  |    |    |
| D3  |    |    |    | X  | X  | X  |    |
| D4  |    |    |    |    | X  | X  | X  |
| D5  | X  |    |    |    |    | X  | X  |
| D6  | X  | X  |    |    |    |    | X  |
| D7  | X  | X  |    | X  |    |    |    |
| D8  |    | X  | X  |    | X  |    |    |
| D9  |    |    | X  | X  |    | X  |    |
| D10 |    |    |    | X  | X  |    | X  |
| D11 | X  |    |    |    | X  | X  |    |
| D12 |    | X  |    |    |    | X  | X  |
| D13 | X  |    | X  |    |    |    | X  |
| D14 | X  | X  |    |    | X  |    |    |
| D15 |    | X  | X  |    |    | X  |    |
| D16 |    |    | X  | X  |    |    | X  |
| D17 | X  |    |    | X  | X  |    |    |
| D18 |    | X  |    |    | X  | X  |    |
| D19 |    |    | X  |    |    | X  | X  |
| D20 | X  |    |    | X  |    |    | X  |
| D21 | X  | X  |    |    |    | X  |    |
| D22 |    | X  | X  |    |    |    | X  |
| D23 | X  |    | X  | X  |    |    |    |
| D24 |    | X  |    | X  | X  |    |    |
| D25 |    |    | X  |    | X  | X  |    |
| D26 |    |    |    | X  |    | X  | X  |
| D27 | X  |    |    |    | X  |    | X  |
| D28 | X  |    | X  | X  |    |    |    |
| D29 |    | X  |    | X  | X  |    |    |
| D30 |    |    | X  |    | X  |    | X  |
| D31 | X  | X  |    | X  |    | X  | X  |
| C0  | X  |    |    |    |    |    |    |
| C1  |    | X  |    |    |    |    |    |
| C2  |    |    | X  |    |    |    |    |
| C3  |    |    |    | X  |    |    |    |
| C4  |    |    |    |    | X  |    |    |
| C5  |    |    |    |    |    | X  |    |
| C6  |    |    |    |    |    |    | X  |

Logic for EC circuit 21 to calculate each syndrome bit S0 through S6 is generated by, for each syndrome bit, performing a logic XOR function on every data bit and correction bit for which there is an "X" in a column for the syndrome bit.

Figure 3:
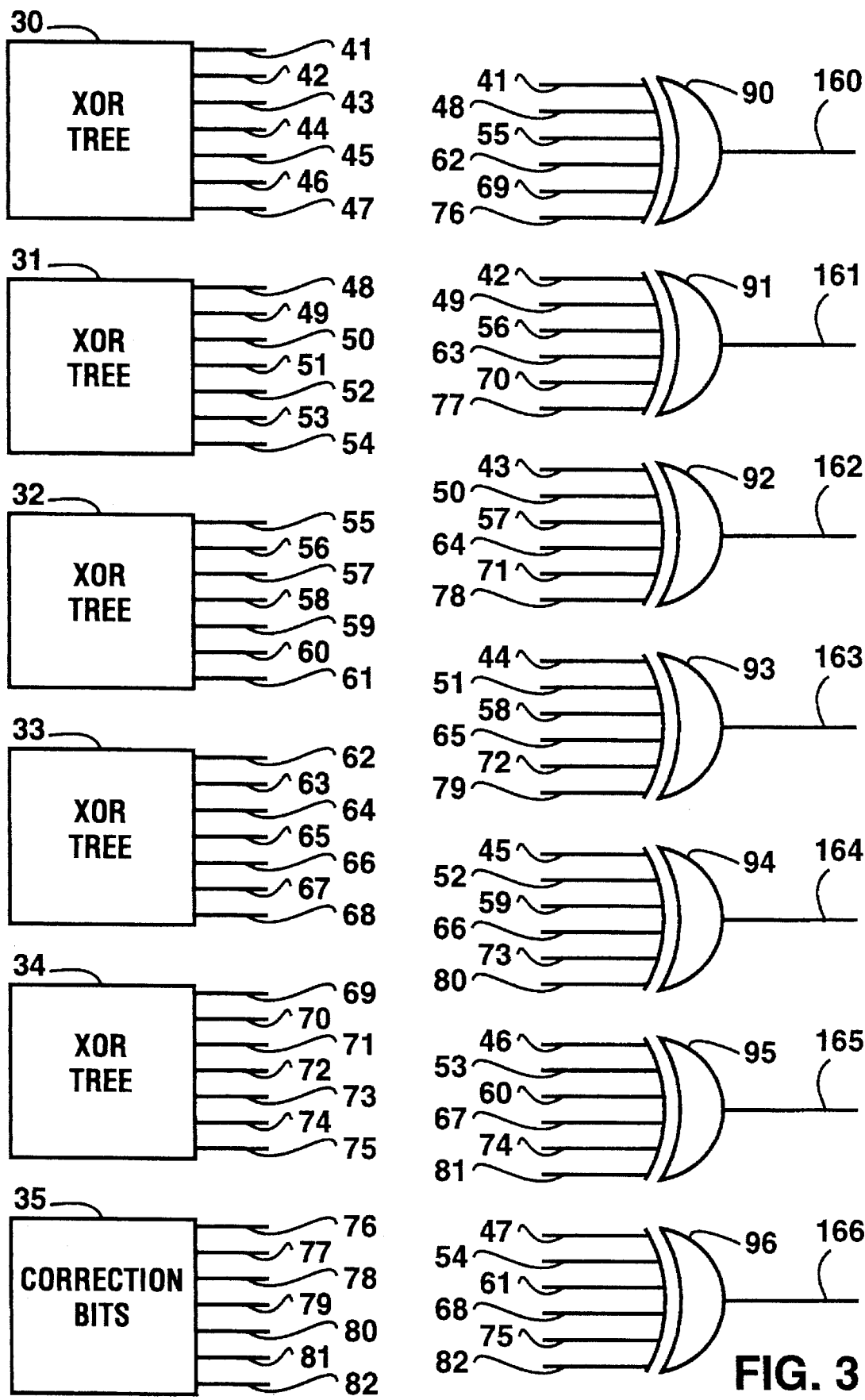
FIG. 3 shows a block diagram of logic used to generate syndrome bits for the error correcting circuitry in FIG. 2, in accordance with the preferred embodiment of the present invention.

FIG. 3 shows a logic block diagram of how EC circuit 21 is arranged on a circuit. An XOR logic gate 90 generates syndrome bit S0 on a line 160 of lines 26. An XOR logic gate 91 generates syndrome bit S1 on a line 161 of lines 26. An XOR logic gate 92 generates syndrome bit S2 on a line 162 of lines 26. An XOR logic gate 93 generates syndrome bit S3 on a line 163 of lines 26. An XOR logic gate 94 generates syndrome bit S4 on a line 164 of lines 26. An XOR logic gate 95 generates syndrome bit S5 on a line 165 of lines 26. An XOR logic gate 96 generates syndrome bit S6 on a line 166 of lines 26.

Inputs for XOR logic gates 90 through 96 are syndrome bit partial products generated by trees of XOR/XNOR logic gates. Each tree of XOR/XNOR logic gates generates syndrome bit partial products from subsets of data bits as shown by Table 1. For example, a tree of XOR logic gates 30 generates syndrome bit partial products from data bits D0 through D6. A tree of XOR logic gates 31 generates syndrome bit partial products from data bits D7 through D13. A tree of XOR logic gates 32 generates syndrome bit partial products from data bits D14 through D20. A tree of XOR logic gates 33 generates syndrome bit partial products from data bits D21 through D27. A tree of XOR logic gates 34 generates syndrome bit partial products from data bits D28 through D31. The syndrome bit partial products are supplied to XOR logic gates on lines 41 through 82, as shown.

Figure 4:
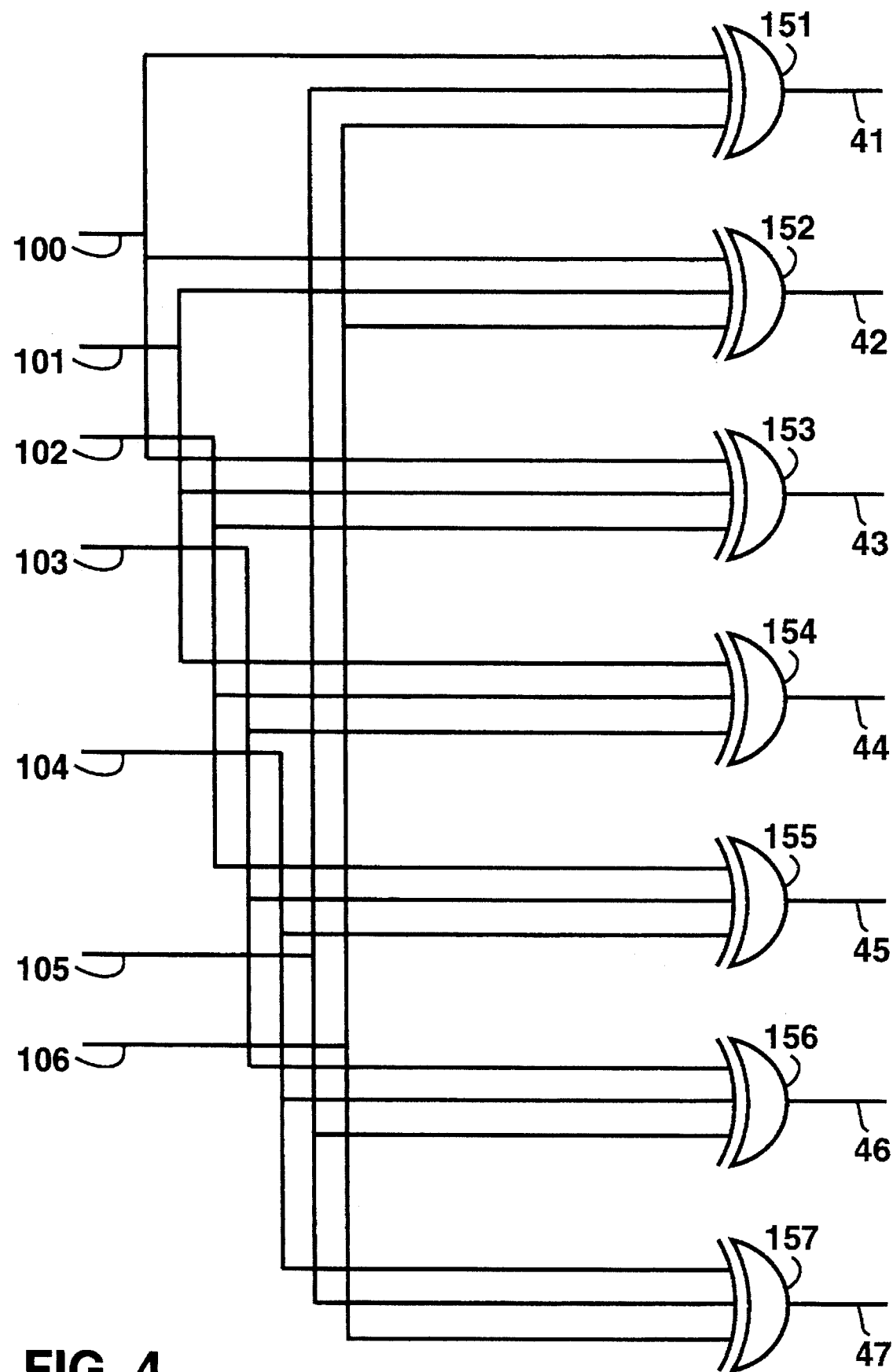
FIG. 4 shows a logic block diagram of a tree of XOR logic gates included in the logic shown in FIG. 3, in accordance with the preferred embodiment of the present invention.

FIG. 4 shows generated logic for tree of XOR logic gates 30. Outputs for tree of XOR logic gates 30 are provided by an XOR logic gate 151, an XOR logic gate 152, an XOR logic gate 153, an XOR logic gate 154, an XOR logic gate 155, an XOR logic gate 156 and an XOR logic gate 157. Inputs for XOR logic gates 151 through 157 are provided by data bit D0 on a line 100, data bit D1 on a line 101, data bit D2 on a line 102, data bit D3 on a line 103, data bit D4 on a line 104, data bit D5 on a line 105 and data bit D6 on a line 106, connected in accordance with the information in Table 1. While FIG. 4 shows only a single XOR gate used to generate each syndrome bit partial product, in an VLSI circuit, a row of two-input XOR gates may used to generate each syndrome bit partial product.

For each tree of XOR logic gates, Table 1 shows which data bits are used to generate syndrome bit partial products for each syndrome bit. Specifically, in Table 1, there is a column for each syndrome bit. For every data bit used to form a syndrome bit partial product for a particular syndrome bit there is an "X" in the column for the particular syndrome bit. For example, XOR tree 30 forms syndrome bit partial products for data bits D0 through D6. Within XOR tree 30, XOR logic gate 151 forms a syndrome bit partial product for syndrome bit S0. Checking column 1, data bits D0, D5 and D6 have "X"s for the S0 column. Likewise, XOR logic gate 152 is used to form a syndrome bit partial product for syndrome bit S1. Inputs to gate 152, therefore, are from each data bit from data bits D0 through D7 which has an "X" in the column for syndrome bit S1. XOR logic gate 153 is used to form a syndrome bit partial product for syndrome bit S2. Inputs to gate 153, therefore, are from each data bit from data bits D0 through D7 which has an "X" in the column for syndrome bit S2. XOR logic gate 154 is used to form a syndrome bit partial product for syndrome bit S3. Inputs to gate 154, therefore, are from each data bit from data bits D0 through D7 which has an "X" in the column for syndrome bit S3. XOR logic gate 155 is used to form a syndrome bit partial product for syndrome bit S4. Inputs to gate 155, therefore, are from each data bit from data bits D0 through D7 which has an "X" in the column for syndrome bit S4. XOR logic gate 156 is used to form a syndrome bit partial product for syndrome bit S5. Inputs to gate 156, therefore, are from each data bit from data bits D0 through D7 which has an "X" in the column for syndrome bit S5. XOR logic gate 157 is used to form a syndrome bit partial product for syndrome bit S6. Inputs to gate 157, therefore, are from each data bit from data bits D0 through D7 which has an "X" in the column for syndrome bit S6. Similarly logic for each of tree of XOR logic gates 31 through 34 may be generated from Table 1.

In the embodiment of the present invention, exemplified by Table 1, each of trees of XOR logic gates 30 through 34 generates a syndrome bit partial product for a subset of data bits. For trees of XOR logic gates 30 through 33, the number of data bits in the subset of data bits is equal to the number of syndrome bits. Within each tree of XOR logic gates 30 through 33, a particular pattern is selected for connections used to connect the first data bit of the subset of the data bits to logic gates which generate the syndrome bit partial products. For each subsequent data bit in the subset of data bits the particular pattern is shifted right.

Thus for tree of XOR logic gates 30, data bit D0 is connected to inputs of XOR logic gate 41, XOR logic gate 42 and XOR logic gate 43. Connections for data bit D1 are shifted right and data bit D1 is thus connected to inputs of XOR logic gate 42, XOR logic gate 43 and XOR logic gate 44. Connections for data bit D2 are shifted right and data bit D2 is connected to inputs of XOR logic gate 43, XOR logic gate 44 and XOR logic gate 45. And so on. The exception is tree of XOR logic gates 34 which has only the last four data bits D28 through D31. The connections for tree of XOR logic gates 34 are as shown.

Table 2 shows a simplified notation which shows how syndrome bits S0 through S6 are calculated by circuit 21.

TABLE 2

| Bit | S0 | S1 | S2 | S3 | S4 | S5 | S6 |
|---|---|---|---|---|---|---|---|
| D0:D6 | X | X | X | | | | |
| D7:D13 | X | X | | X | | | |
| D14:D20 | X | X | | | X | | |
| D21:D27 | X | X | | | | X | |
| D28 | X | | X | | X | | |
| D29 | | X | | X | | X | |
| D30 | | | X | | X | | X |
| D31 | X | X | | X | | X | X |
| C0:C6 | X | | | | | | |

In the first row of Table 2, the connection pattern to be shifted for data bits D0 through D6 is shown. Likewise, in the second row, the connection pattern to be shifted for data bits D7 through D13 is shown. In the third row, the connection pattern to be shifted for data bits D14 through D20 is shown. In the fourth row, the connection pattern to be shifted for data bits D21 through D27 is shown. In the ninth row, the connection pattern to be shifted for correction bits C0 through C6 is shown.

Table 3 shows, using the above-described simplified notation, how syndrome bits S0 through S7 may be calculated for a sixty-four bit balanced distance four error correction code.

TABLE 3

| Bit | S0 | S1 | S2 | S3 | S4 | S5 | S6 | S7 |
|---|---|---|---|---|---|---|---|---|
| D0:D7 | X | X | X | | | | | |
| D8:D15 | X | X | | X | | | | |
| D16:D23 | X | X | | | X | | | |
| D24:D31 | X | X | | | | X | | |
| D32:D39 | X | X | | | | | X | |
| D40:D47 | X | | X | X | | | | |
| D48:D55 | X | | X | | X | | | |
| D56:D63 | X | X | X | X | X | | | |
| C0:C7 | X | | | | | | | |

Similarly, Table 4 shows, using the above-described simplified notation, how syndrome bits S0 through S8 may be calculated for a one hundred twenty-eight bit balanced distance four error correction code.

TABLE 4

| Bit | S0 | S1 | S2 | S3 | S4 | S5 | S6 | S7 | S8 |
|---|---|---|---|---|---|---|---|---|---|
| D0:D7 | X | X | X | | | | | | |
| D9:D17 | X | X | | X | | | | | |
| D18:D26 | X | X | | | X | | | | |
| D27:D35 | X | X | | | | X | | | |
| D36:D44 | X | X | | | | | X | | |
| D45:D53 | X | X | | | | | | X | |
| D54:D62 | X | | X | | X | | | | |
| D63:D71 | X | | X | | | X | | | |
| D72:D80 | X | | X | | | | X | | |
| D81:D83 | X | | | X | | | X | | |
| D84:D92 | X | X | X | X | X | | | | |
| D93:D101 | X | X | X | X | | X | | | |
| D102:D110 | X | X | X | X | | | X | | |
| D111:D119 | X | X | X | X | | | | X | |
| D120 | | X | | X | X | X | | X | |
| D121 | X | | X | X | X | X | X | | |
| D122 | X | | X | | X | X | X | X | X |
| D123 | X | X | | X | | X | X | X | X |
| D124 | X | X | X | | X | | X | | X |
| D125 | X | X | X | X | | X | | X | X |
| D126 | X | X | X | X | X | | X | | X |
| D127 | | X | X | X | X | X | X | | X |
| C0:C7 | X | | | | | | | | |

Table 5 below shows an alternate connection for a sixty-four bit balanced distance four error correction code in accordance with an alternate preferred embodiment of the present invention.

TABLE 5

| Bit | S0 | S1 | S2 | S3 | S4 | S5 | S6 | S7 |
|---|---|---|---|---|---|---|---|---|
| D0 | X | | | | | | X | X |
| D1 | | X | X | X | X | X | | |
| D2 | X | | | | | X | | X |
| D3 | | X | X | X | X | | X | |
| D4 | X | | | | X | | | X |
| D5 | | X | X | X | | X | X | |
| D6 | X | | | X | | | | X |
| D7 | | X | X | | X | X | X | |
| D8 | X | X | | | | | | X |
| D9 | | | X | X | X | X | X | |
| D10 | X | X | | | | X | | |
| D11 | | | X | X | X | X | | X |
| D12 | X | X | | | | X | | |
| D13 | | | X | X | X | | X | X |
| D14 | X | X | | | X | | | |
| D15 | | | X | X | | X | X | X |
| D16 | X | X | X | | | | | |
| D17 | | | | X | X | X | X | X |
| D18 | | X | X | | | | | X |
| D19 | X | | | X | X | X | X | |
| D20 | | X | X | | | | X | |
| D21 | X | | | X | X | X | | X |
| D22 | | X | X | | X | | | |
| D23 | X | | | X | X | | X | X |
| D24 | | X | X | X | | | | |
| D25 | X | | | | X | X | X | X |
| D26 | X | | X | X | | | | |
| D27 | | X | | | X | X | X | X |
| D28 | | | X | X | | | | X |
| D29 | X | X | | | X | X | X | |
| D30 | | | X | X | | | X | |
| D31 | X | X | | | X | X | | X |
| D32 | | | X | X | X | | | |
| D33 | X | X | | | | X | X | X |
| D34 | | X | | X | X | | | |
| D35 | X | | X | | | X | X | X |
| D36 | X | | | X | X | | | |
| D37 | | X | | | | X | X | X |
| D38 | | | X | X | | | | X |
| D39 | X | X | X | | | | X | X |
| D40 | | | | X | X | X | | |
| D41 | X | X | X | | | | X | X |
| D42 | | X | | | X | X | | |
| D43 | X | X | | X | | | X | X |
| D44 | | X | | | | X | X | |

TABLE 5-continued

| Bit | S0 | S1 | S2 | S3 | S4 | S5 | S6 | S7 |
|---|---|---|---|---|---|---|---|---|
| D45 | X |   | X | X |   |   | X | X |
| D46 | X |   |   |   | X | X | X |   |
| D47 |   | X | X | X |   |   | X | X |
| D48 |   |   |   |   | X | X | X |   |
| D49 | X | X | X | X |   |   |   | X |
| D50 |   |   |   | X |   |   | X | X |
| D51 | X | X | X |   | X |   |   | X |
| D52 |   |   | X |   |   |   | X | X |
| D53 | X | X |   |   | X | X |   | X |
| D54 |   | X |   |   |   |   | X | X |
| D55 | X |   | X | X | X |   |   | X |
| D56 |   |   |   |   |   | X | X | X |
| D57 | X | X | X | X | X |   |   | X |
| D58 |   |   |   |   | X |   | X | X |
| D59 | X | X | X | X |   | X |   | X |
| D60 |   |   |   | X |   |   | X | X |
| D61 | X | X | X |   | X | X |   | X |
| D62 |   |   | X |   |   |   | X | X |
| D63 | X | X |   | X | X | X |   | X |
| C0  | X |   |   |   |   |   |   |   |
| C1  |   | X |   |   |   |   |   |   |
| C2  |   |   | X |   |   |   |   |   |
| C3  |   |   |   | X |   |   |   |   |
| C4  |   |   |   |   | X |   |   |   |
| C5  |   |   |   |   |   | X |   |   |
| C6  |   |   |   |   |   |   | X |   |
| C7  |   |   |   |   |   |   |   | X |

Figure 5:
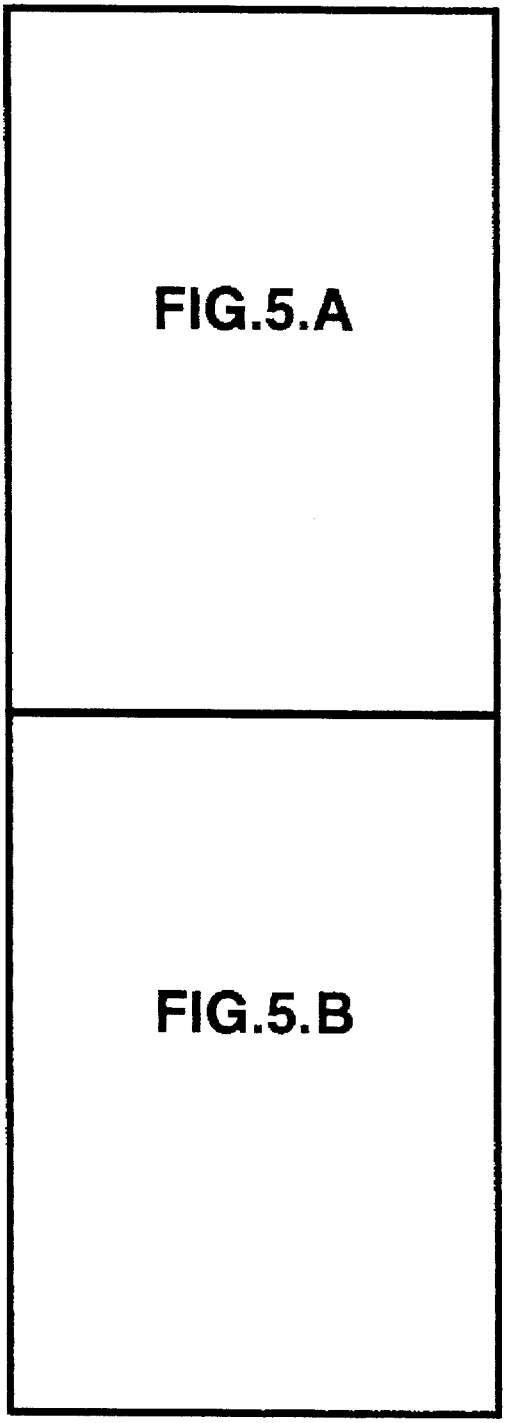
FIG. 5, which includes

FIG. 5, which includes FIGS. 5A and 5B shows a logical block diagram for an EC circuit generated in accordance with Table 5. In FIG. 5, XOR logic gates and XNOR logic gates are alternated to aid in detection of a hardware failure. Alternately, a row of XOR logic gates or a row of XNOR logic gates could be used. An XOR logic gate 230 generates syndrome bit S0 on line 330. An XNOR logic gate 231 generates syndrome bit S1 on line 331. An XOR logic gate 232 generates syndrome bit S2 on line 332. An XNOR logic gate 233 generates syndrome bit S3 on line 333. An XOR logic gate 234 generates syndrome bit S4 on line 334. An XNOR logic gate 235 generates syndrome bit S5 on line 335. An XOR logic gate 236 generates syndrome bit S6 on line 336. An XNOR logic gate 237 generates syndrome bit S7 on line 337.

A tree of XOR logic gates 221 generates partial syndrome bit products from data bits D0 through D7. A tree of XOR logic gates 222 generates partial syndrome bit products from data bits D8 through D15. A tree of XOR logic gates 223 generates partial syndrome bit products from data bits D16 through D23. A tree of XOR logic gates 224 generates partial syndrome bit products from data bits D24 through D31. A tree of XOR logic gates 225 generates partial syndrome bit products from data bits D32 through D39. A tree of XOR logic gates 226 generates partial syndrome bit products from data bits D40 through D47. A tree of XOR logic gates 227 generates partial syndrome bit products from data bits D48 through D55. A tree of XOR logic gates 228 generates partial syndrome bit products from data bits D56 through D63. Connection lines 241 through 312 connects outputs from tree of XOR logic gates 121 through 228 and correction bits 229 to XOR logic gates 230 through 237, as shown.

The logic described by Table 5 has several properties which are very helpful when tree of XOR logic gates 221 through 228 are laid out within an VLSI circuit. Particularly, the row for each odd numbered data bit is the inverse of the row for the immediately previous even numbered data bit. This allows for the regular placement of the same number of XOR logic gates for each row and prevents "bunching" of XOR logic gates with rows.

Further, as can be observed from Table 5, each grouping of eight data bits contains identical columns, allowing for elimination of logic. For example, for bits D0 through D7, the connection pattern in the column for calculating syndrome bit partial products for syndrome bit S0 is identical to the connection pattern in the column for calculating syndrome bit partial products for syndrome bit S7. Therefore, a single XOR logic gate row may be used to calculate a syndrome bit partial product for both syndrome bit S0 and syndrome bit S7. Likewise, for bits D0 through D7, the connection pattern in the column for calculating syndrome bit partial products for syndrome bit S1 is identical to the connection pattern in the column for calculating syndrome bit partial products for syndrome bit S2. Therefore, a single XOR logic gate may be used to calculate a syndrome bit partial product for both syndrome bit S1 and syndrome bit S2. This elimination of logic allows for significant savings in chip area used to implement an error correction circuit.

Figure 6:
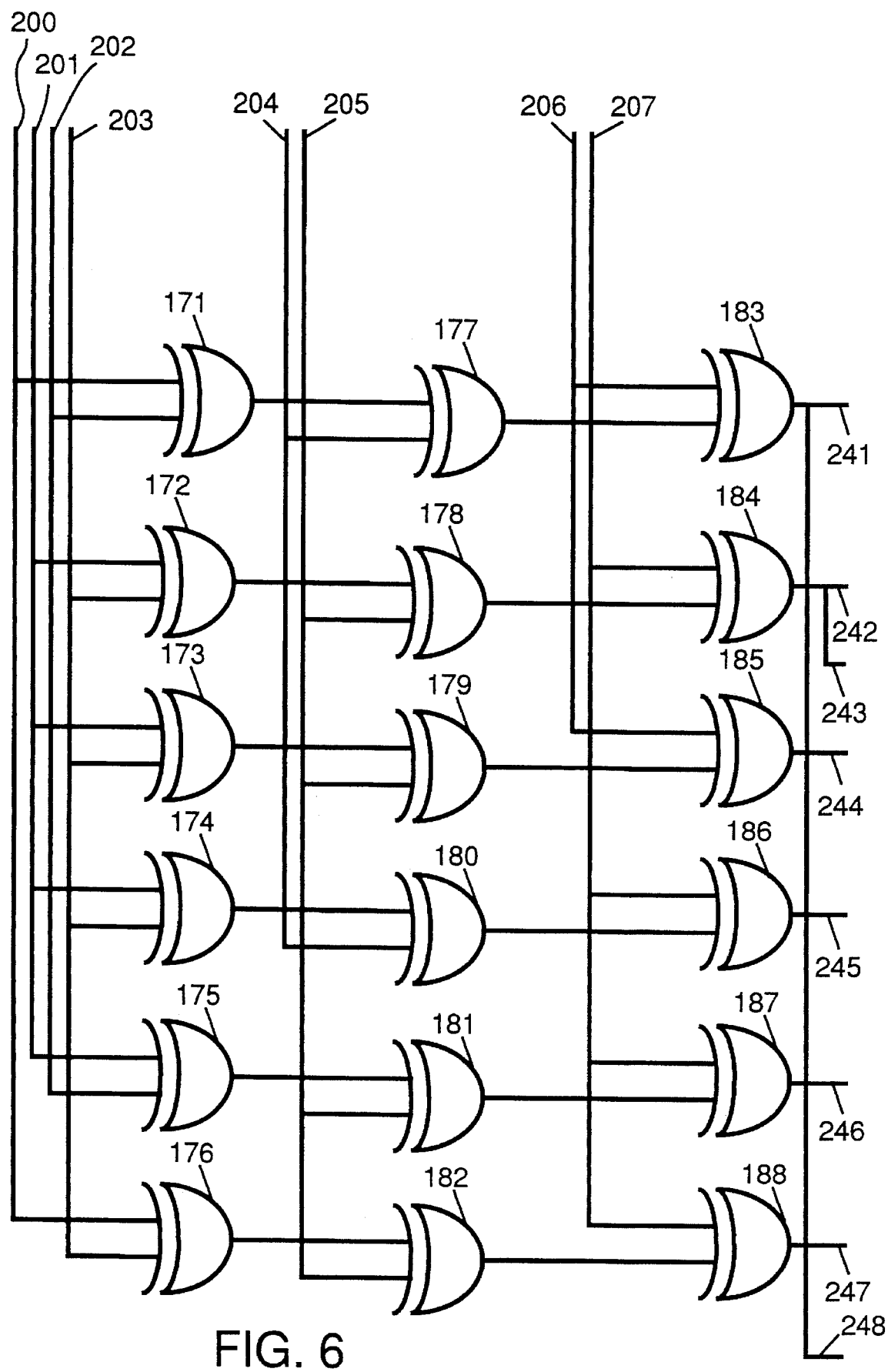
FIG. 6 shows a logic block diagram of a tree of XOR logic gates included in the logic shown in FIG. 5, in accordance with the alternate preferred embodiment of the present invention.

FIG. 6 shows regular placement of generated logic for tree of XOR logic gates 221. The logic shown generates syndrome bit partial products from data bits D0 through D7 on lines 200 through 207, respectively. A syndrome bit partial product used to generate syndrome bit S0 is placed on a line 241. A syndrome bit partial product used to generate syndrome bit S1 is placed on a line 242. A syndrome bit partial product used to generate syndrome bit S2 is placed on a line 243. A syndrome bit partial product used to generate syndrome bit S3 is placed on a line 244. A syndrome bit partial product used to generate syndrome bit S4 is placed on a line 245. A syndrome bit partial product used to generate syndrome bit S5 is placed on a line 246. A syndrome bit partial product used to generate syndrome bit S6 is placed on a line 247. A syndrome bit partial product used to generate syndrome bit S7 is placed on a line 248.

An XOR logic gate 171, an XOR logic gate 177 and an XOR logic gate 183 generates a partial syndrome bit product for syndrome bit S0 and syndrome S7. An XOR logic gate 172, an XOR logic gate 178 and an XOR logic gate 184 generates a partial syndrome bit product for syndrome bit S1 and syndrome S2. An XOR logic gate 173, an XOR logic gate 179 and an XOR logic gate 185 generates a partial syndrome bit product for syndrome bit S3. An XOR logic gate 174, an XOR logic gate 180 and an XOR logic gate 186 generates a partial syndrome bit product for syndrome bit S4. An XOR logic gate 175, an XOR logic gate 181 and an XOR logic gate 187 generates a partial syndrome bit product for syndrome bit S5. An XOR logic gate 176, an XOR logic gate 182 and an XOR logic gate 188 generates a partial syndrome bit product for syndrome bit S6.

As may be observed from Table 5, the columns for each successive groupings of 8 data bits are identical, with the exception that the position of the columns are rotated to the right. For example, logic within tree of XOR logic gates 222 to generate a syndrome bit partial product for syndrome bit S1 from data bits D8 through D15 is identical to logic within tree of XOR logic gates 221 to generate a syndrome bit partial product for syndrome bit S0 from data bits D0 through D7. Logic within tree of XOR logic gates 222 to generate a syndrome bit partial product for syndrome bit S2 from data bits D8 through D15 is identical to logic within tree of XOR logic gates 221 to generate a syndrome bit partial product for syndrome bit S1 from data bits D0 through D7. Logic within tree of XOR logic gates 222 to generate a syndrome bit partial product for syndrome bit S3 from data bits D8 through D15 is identical to logic within tree of XOR logic gates 221 to generate a syndrome bit partial product for syndrome bit S2 from data bits D0 through D7. Logic within tree of XOR logic gates 222 to generate a syndrome bit partial product for syndrome bit S4 from data bits D8 through D15 is identical to logic within tree of XOR logic gates 221 to generate a syndrome bit partial product for syndrome bit S3 from data bits D0 through D7. Logic within tree of XOR logic gates 222 to generate a syndrome bit partial product for syndrome bit S5 from data bits D8 through D15 is identical to logic within tree of XOR logic gates 221 to generate a syndrome bit partial product for syndrome bit S4 from data bits D0 through D7. Logic within tree of XOR logic gates 222 to generate a syndrome bit partial product for syndrome bit S6 from data bits D8 through D15 is identical to logic within tree of XOR logic gates 221 to generate a syndrome bit partial product for syndrome bit S5 from data bits D0 through D7. Logic within tree of XOR logic gates 222 to generate a syndrome bit partial product for syndrome bit S7 from data bits D8 through D15 is identical to logic within tree of XOR logic gates 221 to generate a syndrome bit partial product for syndrome bit S6 from data bits D0 through D7. Logic within tree of XOR logic gates 222 to generate a syndrome bit partial product for syndrome bit S0 from data bits D8 through D15 is identical to logic within tree of XOR logic gates 221 to generate a syndrome bit partial product for syndrome bit S7 from data bits D0 through D7.

Figure 7:
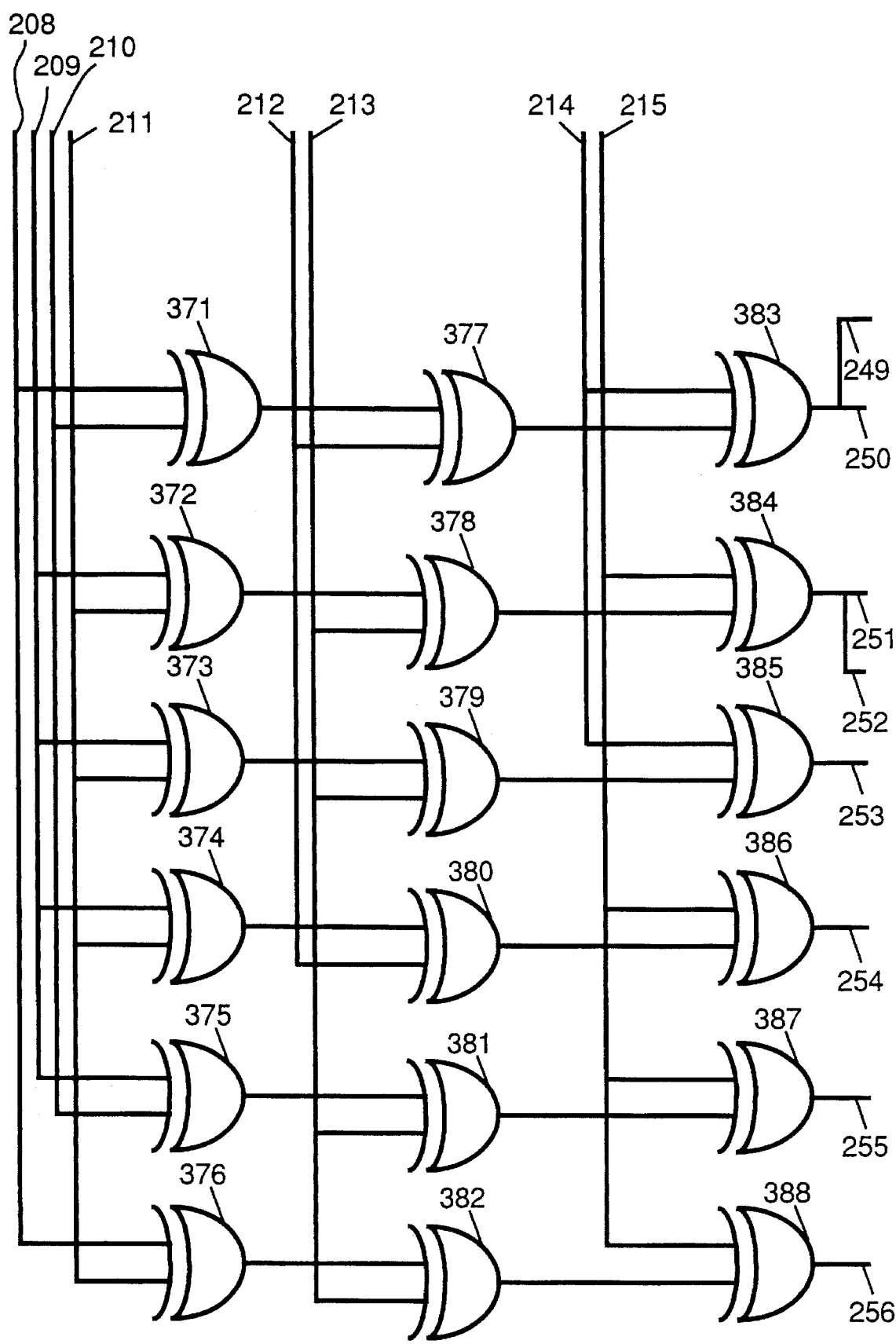
FIG. 7 shows a logic block diagram of a second tree of XOR logic gates included in the logic shown in FIG. 5, in accordance with the alternate preferred embodiment of the present invention.

FIG. 7 shows regular placement of generated logic for tree of XOR logic gates 222. The logic shown generates syndrome bit partial products from data bits D8 through D13 on lines 209 through 215, respectively. A syndrome bit partial product used to generate syndrome bit S0 is placed on a line 249. A syndrome bit partial product used to generate syndrome bit S1 is placed on a line 250. A syndrome bit partial product used to generate syndrome bit S2 is placed on a line 251. A syndrome bit partial product used to generate syndrome bit S3 is placed on a line 252. A syndrome bit partial product used to generate syndrome bit S4 is placed on a line 253. A syndrome bit partial product used to generate syndrome bit S5 is placed on a line 254. A syndrome bit partial product used to generate syndrome bit S6 is placed on a line 255. A syndrome bit partial product used to generate syndrome bit S7 is placed on a line 256.

An XOR logic gate 371, an XOR logic gate 377 and an XOR logic gate 383 generates a partial syndrome bit product for syndrome bit S0 and syndrome S1. An XOR logic gate 372, an XOR logic gate 378 and an XOR logic gate 384 generates a partial syndrome bit product for syndrome bit S2 and syndrome S3. An XOR logic gate 373, an XOR logic gate 379 and an XOR logic gate 385 generates a partial syndrome bit product for syndrome bit S4. An XOR logic gate 374, an XOR logic gate 380 and an XOR logic gate 386 generates a partial syndrome bit product for syndrome bit S5. An XOR logic gate 375, an XOR logic gate 381 and an XOR logic gate 387 generates a partial syndrome bit product for syndrome bit S6. An XOR logic gate 376, an XOR logic gate 382 and an XOR logic gate 388 generates a partial syndrome bit product for syndrome bit S7.

The foregoing discussion discloses and describes merely exemplary methods and embodiments of the present invention. As will be understood by those familiar with the art, the invention may be embodied in other specific forms without departing from the spirit or essential characteristics thereof. For example, all XOR logic gates shown in FIGS. 3 through 7 can be interchanged with XNOR logic gates without adversely affecting performance. Accordingly, the disclosure of the present invention is intended to be illustrative, but not limiting, of the scope of the invention, which is set forth in the following claims.

We claim:
1. Circuitry for generating syndrome bits from a plurality of data bits and a plurality of correction bits, the circuitry comprising:
   a plurality of tree means for generating syndrome bit partial products, each tree means generating a plurality of syndrome bit partial products from a subset of the data bits;
   a combination means, coupled to the plurality of tree means, for generating the syndrome bits from the syndrome bit partial products generated by the plurality of tree means and from the correction bits, wherein the combination means uses more than one syndrome bit partial product to generate each syndrome bit.

2. Circuitry as in claim 1 wherein each tree means in the plurality of tree means comprises XOR/XNOR logic gates arranged in rows, each row of XOR/XNOR logic gates being used to generate a syndrome bit partial product for at least one syndrome bit.

3. Circuitry as in claim 2 wherein at least one row of XOR/XNOR logic gates generates a syndrome bit partial product for at least two syndrome bits.

4. Circuitry as in claim 2 wherein within each subset of data bits, the data bits are arranged in pairs, no XOR/XNOR logic gate receiving input from both data bits in a pair.

5. Circuitry as in claim 2 wherein all the tree means have identical rows of XOR/XNOR logic gates, the rows being in a different order for each tree means.

6. Circuitry as in claim 2 wherein there are thirty-two data bits, seven correction bits and seven syndrome bits.

7. Circuitry as in claim 2 wherein there are sixty-four data bits, eight correction bits and eight syndrome bits.

8. Circuitry for generating syndrome bits from a plurality of data bits and a plurality of correction bits, the circuitry comprising:
   a plurality of tree means for generating syndrome bit partial products, each tree means generating syndrome bit partial products from a subset of the data bits
   wherein each tree means in the plurality of tree means comprises XOR/XNOR logic gates arranged in rows, each row of XOR/XNOR logic gates being used to generate a syndrome bit partial product for at least one syndrome bit,
   wherein the XOR/XNOR logic gates are also arranged in columns,
   wherein within each subset of data bits, the data bits are arranged in pairs,
   wherein each pair of data bits provides input to only one column of XOR/XNOR logic gates and
   wherein when a first pair of data bits provides input to a first column, each XOR/XNOR logic gate within the first column receives input from one and only one data bit within the first pair of data bits; and,
   a combination means, coupled to the plurality of tree means, for generating the syndrome bits from the syndrome bit partial products generated by the plurality of tree means and from the correction bits, wherein the combination means uses more than one syndrome bit partial product to generate each syndrome bit.

9. Circuitry as in claim 8 wherein at least one row of XOR/XNOR logic gates generates a syndrome bit partial product for at least two syndrome bits.

10. Circuitry as in claim 8 wherein all the tree means have identical rows of XOR/XNOR logic gates, the rows being arranged differently for each tree means.

11. A method for generating syndrome bits from a plurality of data bits and a plurality of correction bits, the method comprising the steps of:

(a) dividing the plurality of data bits into subsets;

(b) from each subset of data bits, generating, in parallel, a plurality of syndrome bit partial products, each plurality of syndrome bit partial products including a syndrome bit partial product for each syndrome bit; and, (c) generating the syndrome bits from the syndrome bit partial products and from the correction bits, including the substep of using more than one syndrome bit partial product to generate each syndrome bit.

12. A method as in claim 11 wherein in step (b) the plurality of syndrome bit partial products are generated by XOR/XNOR logic gates arranged in rows, each row of XOR/XNOR logic gates being used to generate a syndrome bit partial product for at least one syndrome bit.

13. A method as in claim 12 wherein in step (b) for each plurality of syndrome bit partial products generated, identical rows of XOR/XNOR logic gates are used, the rows being arranged in a different order for each plurality of syndrome bit partial products generated.

14. A method as in claim 12 wherein there are thirty-two data bits, seven correction bits and seven syndrome bits.

15. A method as in claim 12 wherein there are sixty-four data bits, eight correction bits and eight syndrome bits.

16. A method as in claim 12 wherein in step (b) at least one row of XOR/XNOR logic gates generates a syndrome bit partial product for at least two syndrome bits.

17. A method as in claim 16 wherein in step (b), the bits are arranged in pairs within each subset of data bits, no XOR/XNOR logic gate receiving input from both data bits in a pair.

18. A method for generating syndrome bits from a plurality of data bits and a plurality of correction bits, the method comprising the steps of:

(a) dividing the plurality of data bits into subsets;

(b) from each subset of data bits, generating a plurality of syndrome bit partial products, each plurality of syndrome bit partial products including a syndrome bit partial product for each syndrome bit, wherein the plurality of syndrome bit partial products are generated by XOR/XNOR logic gates arranged in rows, each row of XOR/XNOR logic gates being used to generate a syndrome bit partial product for at least one syndrome bit wherein the XOR/XNOR logic gates are also arranged in columns, wherein within each subset of data bits, the data bits are arranged in pairs, wherein each pair of data bits provides input to only one column of XOR/XNOR logic gates and wherein when a first pair of data bits provides input to a first column, each XOR/XNOR logic gate within the first column receives input from one and only one data bit within the first pair of data bits; and, (c) generating the syndrome bits from the syndrome bit partial products and from the correction bits, including the substep of using more than one syndrome bit partial product to generate each syndrome bit.

19. A method as in claim 18 wherein in step (b) at least one row of XOR/XNOR logic gates generates a syndrome bit partial product for at least two syndrome bits.

20. A method as in claim 18 wherein in step (b) for each plurality of syndrome bit partial products generated, identical rows of XOR/XNOR logic gates are used, the rows being arranged differently for each plurality of syndrome bit partial products generated.

* * * * *